(12) United States Patent
Aga et al.

(10) Patent No.: US 7,560,313 B2
(45) Date of Patent: Jul. 14, 2009

(54) SOI WAFER AND METHOD FOR PRODUCING THE SAME

(75) Inventors: Hiroji Aga, Gunma (JP); Kiyoshi Mitani, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 811 days.

(21) Appl. No.: 10/473,352

(22) PCT Filed: Mar. 29, 2002

(86) PCT No.: PCT/JP02/03162

§ 371 (c)(1),
(2), (4) Date: Sep. 30, 2003

(87) PCT Pub. No.: WO02/084738

PCT Pub. Date: Oct. 24, 2002

(65) Prior Publication Data

US 2004/0219370 A1    Nov. 4, 2004

(30) Foreign Application Priority Data

Apr. 6, 2001   (JP) .............................. 2001-108643

(51) Int. Cl.
*H01L 21/00* (2006.01)

(52) U.S. Cl. .................. 438/149; 438/152; 438/164; 438/404; 438/407; 438/455; 257/E21.122; 257/E21.228

(58) Field of Classification Search .............. 257/347, 257/E27.112, E21.32, E21.507, E21.248; 438/152, 407

See application file for complete search history.

(56) References Cited

U.S. PATENT DOCUMENTS 4,104,090 A * 8/1978 Pogge ........................ 438/409

(Continued)

FOREIGN PATENT DOCUMENTS

EP           0 955 671 A1      11/1999

(Continued)

OTHER PUBLICATIONS

Francois J. Henley et al.; "A New SOI Manufacturing Technology Using Atomic Layer Cleaving"; *Semiconductor Fabtech*; vol. 12: pp. 201-205; Jul. 2000.

(Continued)

*Primary Examiner*—N Drew Richards
*Assistant Examiner*—Kyoung Lee
(74) *Attorney, Agent, or Firm*—Oliff & Berridge, PLC

(57) ABSTRACT

The present invention provides a SOI wafer produced by an ion implantation delamination method wherein a width of a SOI island region in a terrace portion generated in an edge portion of the SOI wafer where a surface of a base wafer is exposed is narrower than 1 mm and a density of pit-shaped defects having a size of 0.19 μm or more existing in a surface of a SOI layer detected by a LPD inspection is 1 counts/cm² or less, and also provides a method for producing the SOI wafer. Thereby, there is provided a SOI wafer produced by an ion implantation delamination method wherein generation of SOI islands generated in delamination can be suppressed and a defect density of LPDs existing in a surface of the SOI wafer can be reduced, and a method for producing the same, so that device failure can be reduced.

1 Claim, 3 Drawing Sheets

U.S. PATENT DOCUMENTS

| | | | |
|---|---|---|---|
| 4,717,681 A * | 1/1988 | Curran | 438/314 |
| 4,760,036 A * | 7/1988 | Schubert | 117/89 |
| 4,849,370 A * | 7/1989 | Spratt et al. | 438/409 |
| 6,245,645 B1 * | 6/2001 | Mitani et al. | 438/455 |
| 6,284,628 B1 * | 9/2001 | Kuwahara et al. | 438/459 |
| 6,284,629 B1 * | 9/2001 | Yokokawa et al. | 438/459 |
| 6,312,797 B1 * | 11/2001 | Yokokawa et al. | 428/336 |
| 6,372,609 B1 * | 4/2002 | Aga et al. | 438/459 |
| 2002/0068418 A1 * | 6/2002 | Stanley et al. | 438/458 |

FOREIGN PATENT DOCUMENTS

| | | |
|---|---|---|
| EP | 0 961 312 A2 | 12/1999 |
| EP | 0 971 395 A1 | 1/2000 |
| EP | 1 045 448 A1 | 10/2000 |
| JP | A 3-87012 | 4/1991 |
| JP | A 9-64321 | 3/1997 |
| JP | A 11-145438 | 5/1999 |
| JP | 11-251277 | 9/1999 |
| JP | A 11-307413 | 11/1999 |
| JP | A 11-329997 | 11/1999 |
| JP | A 2000-49063 | 2/2000 |
| KR | 2000-11625 | 2/2000 |

OTHER PUBLICATIONS

Kiyoshi Mitani, "Smart Cut (R) SOI Gijutsu no Shinpo to Doko", Cho LSI Ultra Clean Technology Synposium, vol. 33 (JP), UCS Handotai Kiban Gijutsu Kenkyukai, May 27, 1999, pp. 199 to 126.

Bruel, M. et al. "(R) "Smart Cut": A promising new SOI material technology", IEEE International SOI Conference, pp. 178-179, Oct. 1995.

* cited by examiner

F I G. 1
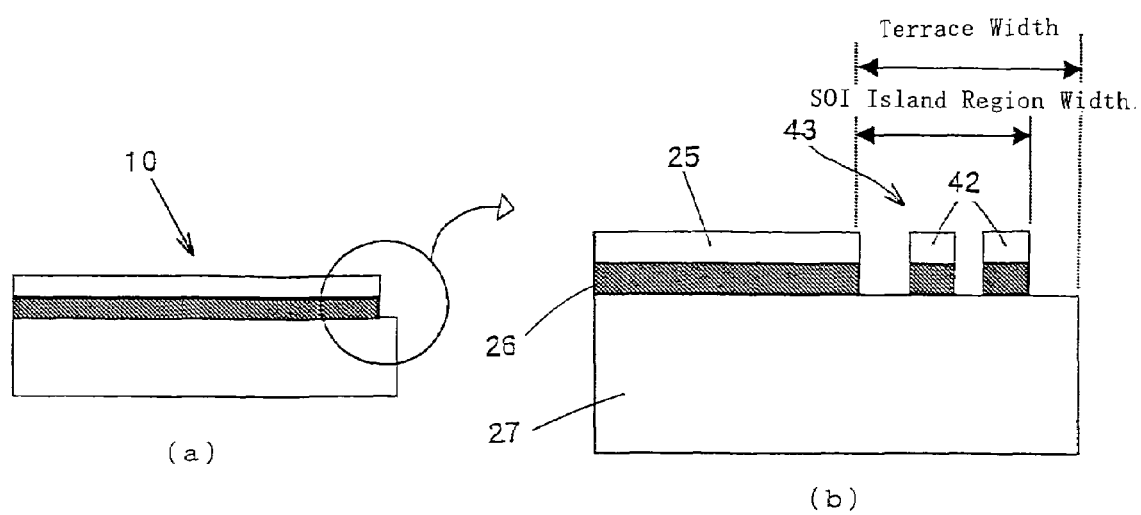
F I G. 2
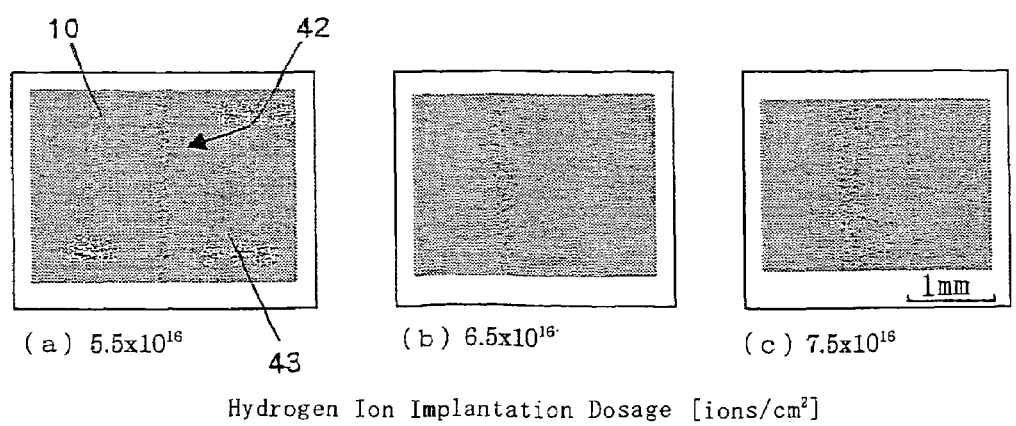
Hydrogen Ion Implantation Dosage [ions/cm$^2$]

F I G. 3
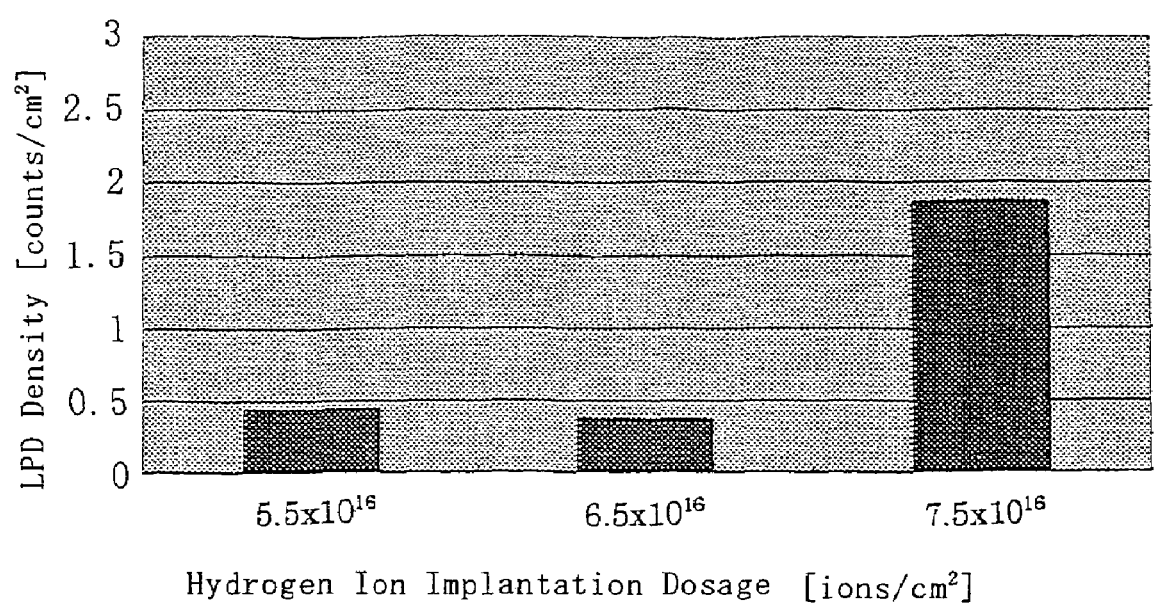

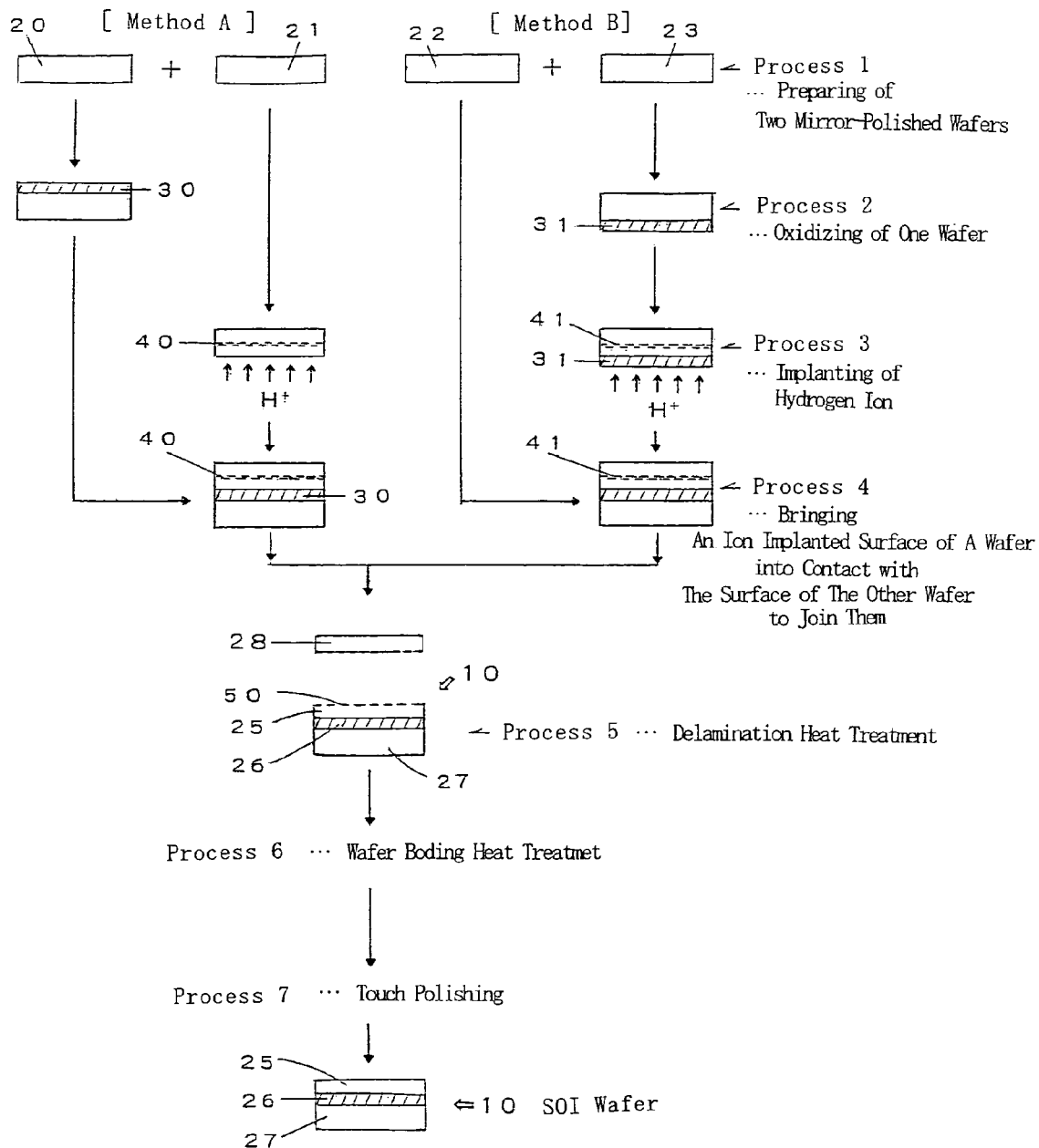

SOI WAFER AND METHOD FOR PRODUCING THE SAME

This application is a 371 of PCT/JP02/03162 filed Mar. 29, 2002 and this application claims the benefit under 35 U.S.C. §119(e) of prior to foreign application JAPAN 2001-108643 filed Apr. 6, 2001.

TECHNICAL FIELD

The present invention relates to a method for producing a SOI wafer by bonding of an ion-implanted wafer and a wafer and delamination, so-called ion implantation delamination method (also called a hydrogen ion delamination method or smart-cut method), which can suppress generation of SOI islands generated in a terrace portion and generation of LPD generated in a surface of the SOI wafer, so that device failure can be reduced.

BACKGROUND ART

The ion implantation delamination method is a method of producing a SOI wafer by bonding of a wafer into which hydrogen ions or rare gas ions and a wafer and delamination. However, there is a case where a SOI layer is not transferred on an edge portion of the SOI wafer after delamination, and accordingly a terrace portion where a surface of a base wafer (support substrate) is exposed is generated. This is mainly due to that the bonding strength between the bonded wafers is weak in the edge portion of the wafers, and therefore, a SOI layer is difficult to be transferred on a base wafer side. When the SOI terrace portion was observed by a optical microscope, it was found that SOI islands which are pieces of isolated island-shaped SOI layer were generated in the edge portion of the SOI layer. It is expected that such SOI islands come off from the wafer by etching to eliminate a buried oxide film (may be called a BOX oxide film) during a cleaning by use of an aqueous solution containing HF (hydrofluoric acid) in a device fabrication process, and accordingly, they cause device failure because they adhere to a device fabrication region of the wafer again as silicon particles.

FIG. 1 show cross sectional views of an edge portion of the SOI wafer produced by an ion implantation delamination method.

FIG. 1(a) is a SOI wafer 10, and FIG. 1(b) shows the detail of its edge portion. FIG. 1(b) schematically shows the state that the SOI wafer 10 comprises a SOI layer 25, a buried oxide film 26 and a base wafer 27, and a terrace portion 43 where a surface of the base wafer is exposed and SOI islands 42 which are pieces of isolated island-shaped SOI layer are generated in the edge portion.

On the other hand, as SOI wafers produced by the ion implantation delamination method have been observed by an optical surface inspection apparatus, it has been found that defects detected as LPD exist. The LPD (Light Point Defect) is a generic term of the defect, which appears as a spot when a surface of the wafer is observed under a condenser lamp. Although this defect has not been identified, it is considered that a device yield is affected because nearly all the defects are shallow pits and become holes which pass through a SOI layer when a SOI layer is oxidized to be thin.

DISCLOSURE OF THE INVENTION

The present invention has been accomplished in view of the above-mentioned problems, and a main object of the present invention is to provide a SOI wafer produced by an ion implantation delamination method wherein generation of SOI islands generated in delamination are suppressed and the defect density of LPD existing in a surface of the SOI wafer is reduced, and also provide a method for producing the same, so that the device failure is reduced.

In order to solve the above problems, the present invention provides a SOI wafer produced by an ion implantation delamination method wherein a width of a SOI island region in a terrace portion generated in an edge portion of the SOI wafer where a surface of a base wafer is exposed is narrower than 1 mm.

As described above, in the present invention, the SOI wafer of which width of a SOI island region in a terrace portion generated in an edge portion where a surface of a base wafer is exposed is narrower than 1 mm can be obtained. And if the width of a SOI island region is narrower than 1 mm like this, there will be few cases where SOI islands come off from the wafer by etching to eliminate a buried oxide film during a HF cleaning in a device fabrication process, and they cause device failure on the ground that they reattached as silicon particles to a device fabrication region. Accordingly, the device yield can be improved.

Further, the SOI wafer according to the present invention is the SOI wafer produced by an ion implantation delamination method wherein a density of pit-shaped defects having a size of 0.19 μm or more existing in a surface of a SOI layer detected by a LPD inspection is 1 counts/cm² or less.

As described above, in the present invention, a SOI wafer having extremely few pit-shaped defects can be obtained. And if a density of pit-shaped defects having a size of 0.19 μm or more existing in a surface of a SOI layer detected as a LPD is 1 counts/cm² or less, device failure can be reduced, and thus, device yield can be improved.

Next, a method for producing a SOI wafer according to the present invention is the method for producing a SOI wafer by an ion implantation delamination method wherein a lower limit of an implantation dosage of hydrogen ions or rare gas ions is determined by a delamination phenomenon, and an upper limit of an implantation dosage of hydrogen ions or rare gas ions is determined by a width of a SOI island region in a terrace portion or a density of pit-shaped defects detected by a LPD inspection of the SOI wafer.

If the implantation dosage of hydrogen ions or rare gas ions is determined by this manner and the ions are implanted, the SOI wafer such that generation of SOI islands, which is easily generated in delamination, are suppressed or a defect density of LPD existing in a surface of the SOI wafer is reduced can be produced.

Specifically, the implantation dosage of hydrogen ions is $5\times10^{16}$ ions/cm² or more and less than $7.5\times10^{16}$ ions/cm².

According to this method, since a width of a region of SOI islands which are easily generated in delamination can be reduced to 1 mm or less, the SOI wafer of which a SOI layer can be certainly transferred to a base wafer and a defect density of LPD existing in a surface is extremely reduced can be produced. Further, by determining the implantation dosage in the above range, the wafer can be stably delaminated.

As described above, according to the present invention, a SOI wafer produced by an ion implantation delamination method wherein generation of SOI islands generated in delamination is suppressed and a defect density of LPD existing in a surface of the SOI wafer is reduced and a method for producing the same can be provided, and accordingly device failure can be reduced.

BRIEF DESCRIPTION OF THE DRAWINGS

FIG. 1 include schematic diagrams showing a terrace and SOI islands generating in an edge portion of a SOI wafer;
(a) A SOI wafer, and (b) an edge portion of the SOI wafer.
FIG. 2 includes optical microscope photographs showing variations of a SOI island region width and a terrace width depending on the ion implantation dosages (ions/cm$^2$);
(a) $5.5 \times 10^{16}$, (b) $6.5 \times 10^{16}$, and (c) $7.5 \times 10^{16}$.
FIG. 3 is a diagram showing variations of LPD densities (counts/cm$^2$) in wafer surfaces relative to ion implantation dosages.
FIG. 4 is a flow chart showing one example of a production process of a SOI wafer according to the present invention.

BEST MODE FOR CARRYING OUT THE INVENTION

Hereinafter, the present invention will now be described in detail.

Inventors of the present invention found that, in order to produce a SOI wafer by an ion implantation delamination method wherein generation of SOI islands generated in delamination is suppressed or a defect density of LPD existing in a surface of the SOI wafer is reduced, it is sufficient to control an implantation dosage of hydrogen ions or rare gas ions within a predetermined range, and they carefully examined its conditions and accomplished the present invention.

A so-called SOI island, which remains at a certain width in a terrace portion generated in an edge portion of the SOI wafer where a surface of a base wafer is exposed, can be observed after delamination heat treatment. And it is considered that delamination in an ion implantation delamination method occurs due to a growth of defects induced by hydrogen or rare gas generated during delamination heat treatment and a strength of rapid volume expansion due to vaporization of implanted hydrogen or rare gas. And it is also considered that in the edge portion of the wafer having the terrace portion, generation of SOI islands is mainly due to that a bonding strength between the bonded wafers is weak under the influence of polishing sags in each edge portion of wafer surfaces to be bonded, and a SOI layer is difficult to be transferred to a base wafer side.

In consideration of such characteristics of a delamination phenomenon, inventors of the present invention found that if an implantation dosage of hydrogen ions is reduced less than a conventional dosage of $8 \times 10^{16}$ ions/cm$^2$, a width of a SOI island region can be reduced.

Namely, if the implantation dosage of hydrogen ions is $5 \times 10^{16}$ ions/cm$^2$ or more and less than $7.5 \times 10^{16}$/cm$^2$, the width of a SOI island region can be 1 mm or less and a density of pit-shaped defects having a size of 0.19 μm or more existing in a surface of a SOI layer detected by a LPD inspection can be 1 counts/cm$^2$ or less.

The reason why the width of a SOI island region is extended when the implantation dosage of hydrogen ions is $7.5 \times 10^{16}$ ions/cm$^2$ or more is not clear up to the present. However, it is considered that, if an implantation dosage is larger than necessary, delamination occurs as hydrogen induced defects are insufficiently grown since the strength of expansion due to vaporization of hydrogen is too strong, and thus, the region where delamination occurs in the state that there is no connection in a lateral direction like SOI islands is generated.

Further, if a dosage of hydrogen is less than $5 \times 10^{16}$ ions/cm$^2$, formation of defects and strength of expansion due to vaporization of hydrogen is not sufficient since the implantation dosage of hydrogen is too small. Thus, a SOI layer is only partially transferred to a base wafer, the whole surface of the wafer is not delaminated. Therefore, it was found that the SOI wafer can not be made up. Consequently, it is necessary to control the dosage of hydrogen to $5 \times 10^{16}$ ions/cm$^2$ or more and less than $7.5 \times 10^{16}$ ions/cm$^2$ in the ion implantation delamination method. And in order to stably perform delamination, the implantation dosage is preferably $5.5 \times 10^{16}$ ions/cm$^2$ or more, more preferably more than $6 \times 10^{16}$ ions/cm$^2$ to produce a SOI wafer.

As described above, as to the implantation dosage of hydrogen ions, the existence of the optimum range of the dosage was revealed. And, in consideration of the above mechanism, it can be supposed that this phenomenon is also applied to the case where not only hydrogen ions but also rare gas ions are implanted.

Further, when a surface of the SOI layer was observed by an optical surface inspection apparatus, it was found that a density of defects detected as LPD depends on an implantation dosage of hydrogen ions, and when the implantation dosage is $7.5 \times 10^{16}$ ions/cm$^2$ or more, LPDs are extremely increased. Although LPDs existed about 2 counts/cm$^2$ or more when the conventional implantation dosage of $8 \times 10^{16}$ ions/cm$^2$ was implanted, LPDs can be sharply decreased to 1 counts/cm$^2$ or less.

As described above, in the present invention, an lower limit of the implantation dosage of hydrogen ions or rare gas ions is determined by a delamination phenomenon, and an upper limit of the implantation dosage of hydrogen ions or rare gas ions is determined by a width of a SOI island region in the terrace portion or a density of pit-shaped defects detected by a LPD inspection of the SOI wafer.

Hereinafter, the present invention will be further explained in detail with reference to the drawings.

FIG. 4 is a flow chart showing one example of the production process of a SOI wafer in the ion implantation delamination method in which a hydrogen ion implanted wafer is bonded to a wafer and delaminated.

Hereinafter, the case of bonding two silicon wafers will be mainly explained.

The ion implantation delamination method in which a SOI wafer is produced by bonding of an ion-implanted wafer and a wafer and delamination has, for example, two methods of A and B of which are different in the order of processing steps. First, the method A will be explained.

In the process 1 of the method A, two mirror-polished silicon wafers are required to be prepared. That is, wafers 20 and 21, which are satisfied with specifications of a device, are prepared. In the process 2, at least one wafer, i.e., the wafer 20 is thermally oxidized to form an oxide film 30 having a thickness of about 0.1-2.0 μm on its surface. In the process 3, hydrogen ions or rare gas ions are implanted (hydrogen ions are implanted here) into one side surface of the other wafer 21 to form a microcavity layer (implanted layer) 40 at an average penetration depth of the ions in parallel with its surface. And its implantation temperature is preferably 25-450° C. The process 4 is the process such that a hydrogen ion implanted surface of the hydrogen ion implanted wafer 21 is brought into contact with a surface of the oxide film 30 formed on the wafer 20 to be joined together. By contact of each surface of two wafers under a clean atmosphere at room temperature, both wafers are joined without an adhesive agent or the like.

Next, the process 5 is a delamination heat treatment process such that the joined wafer is separated into an upper silicon 28 (delamination wafer) and a lower SOI wafer 10 (a SOI layer 25+a buried oxide film 26+a base wafer 27) by an implanted layer 40 which is a boundary. When heat treatment is performed at a temperature of 400-600° C. or more under an inert gas atmosphere, the joined wafer is separated into the upper silicon and the lower SOI wafer by growth of hydrogen induced defects generated during the delamination heat treatment process and strength of rapid volume expansion due to vaporization of implanted hydrogen. The delaminated upper silicon 28 is removed.

Additionally, as one of ion implantation delamination method, it has been developed recently that implantation ions are implanted in a state of plasma so that the delamination process is performed at room temperature. In this case, the above delamination heat treatment is unnecessary.

Then, in the process 6, since the bonding strength between the wafers joined with each other in the process 4 which is the joining process is too weak to be used, as it is, in a device process, it is necessary to subject the lower SOI wafer 10 to heat treatment to have a sufficient bonding strength. This heat treatment is preferably performed for thirty minutes to two hours at a temperature of 1050-1200° C. under an inert gas atmosphere.

Additionally, it is possible to continuously perform delamination heat treatment in the process 5 and bonding heat treatment in the process 6, i.e., to continuously perform delamination heat treatment in the process 5 and bonding heat treatment in the process 6 without removing the upper silicon wafer to be delaminated in the process 5 from the lower SOI wafer, or it is also possible to perform heat treatment as combining the heat treatment in processes 5 with the heat treatment in processes 6.

Then, in the process 7, which is a touch polishing process, mirror-polishing is performed for a cleaved surface 50 so that the stock removal of the polishing can be 70-130 nm, preferably about 100 nm.

After the above processes, a high quality SOI wafer 10 having a SOI layer 25 with high uniformity of film thickness which is a layer having no crystal defects can be produced.

Next, as to the method for producing a SOI wafer according to the method B, in the process 1, two mirror-polished silicon wafers 22 and 23, which are satisfied with the specification of a device, are prepared. In the process 2, at least one out of two wafers, i.e., the wafer 23 is thermally oxidized to form an oxide film 31 having a thickness of about 0.1-2.0 μm on its surface. In the process 3, hydrogen ions or rare gas ions are implanted (hydrogen ions are implanted here) from a surface of the oxide film 31 on the wafer 23 to form a microcavity layer (implanted layer) 41 at an average penetration depth of ions in parallel with its surface. And its implantation temperature is preferably 25-450° C. The process 4 is the process such that a surface of the oxide film 31 serving as a hydrogen ion implanted surface of the hydrogen ion implanted wafer 23 is brought into contact with the silicon wafer 22, and by contact of each surface of two wafers under a clean atmosphere at a room temperature, both wafers are joined without a adhesive agent or the like. Next, after the processes 5 to 7 conducted by the same processes as the method A, a SOI wafer with a uniform film thickness which have no crystal defects can be obtained.

In the present invention, the ion implantation dosage at the time when hydrogen ions are implanted into one wafer in the process 3 of the ion implantation delamination method is $5 \times 10^{16}$ ions/cm² or more and less than $7.5 \times 10^{16}$/cm². According to this, a width of a SOI island region in a edge portion of the SOI wafer, which is easily generated in delamination, can be reduced to 1 mm or less, and a SOI wafer of which defect density of LPD existing in a surface of the SOI wafer is extremely reduced can be produced. Further, when the implantation dosage falls within the above range, the wafers can be stably delaminated.

Hereinafter, the present invention will be explained specifically in reference to the example, but the present invention is not limited thereto.

EXAMPLE

By using a MCZ method (Magnetic field applied Czochralski method) in which crystal was pulled while applying a magnetic field, a silicon single crystal of which so-called grown-in defects were reduced was pulled while controlling pulling conditions. The ingot of the crystal was processed in a normal manner, and mirror-polished silicon wafers (a diameter of 200 mm, crystal orientation of <100>, conductive type of p-type, and resistivity of 10 Ω·cm) of which COPs were reduced in the whole crystal were produced.

The surface of the wafers was measured in terms of COP by a surface inspection apparatus (SP-1, product of KLA-Tencor Corporation), and it was found that no COP having a diameter of 0.19 μm or more existed. The COP (Crystal originated Particle) was a void type defect having a size of about 0.1-0.2 μm, which is one of grown-in defects.

Next, based on process conditions below, three SOI wafers per each condition were produced from the wafers produced above by an ion implantation delamination method.

1) Thickness of a buried oxide film: 145 nm, and Thickness of a SOI film: 160 nm.

2) Conditions of hydrogen ion implantation; Implantation energy: 56 keV, Dosages: six standards of $4.5 \times 10^{16}$, $5.5 \times 10^{16}$, $6.5 \times 10^{16}$, $7.0 \times 10^{16}$, $7.5 \times 10^{16}$, and $8.5 \times 10^{16}$ ions/cm².

3) Delamination heat treatment; Temperature: 500° C., Time: 30 minutes, and Atmosphere: an inert gas (Ar).

4) Bonding heat treatment; Temperature: 1100° C., Time: 2 hours.

5) Touch polishing; Stock removal: 100 nm.

After the SOI wafers were produced based on each dosage described above, the SOI wafers was measured about each SOI island region width and terrace width by a optical microscope. The results of the measurements are shown in Table 1 and FIG. 2.

From these results, it was found that the width of the region where the SOI islands 42 exist was sharply expanded when the hydrogen implantation dosage was $7.5 \times 10^{16}$ ions/cm² or more. Further, when the width of a SOI island region was expanded, the width of the terrace 43 was also expanded by the same tendency.

Further, it was found that when the hydrogen dozage was less than $5 \times 10^{16}$ ions/cm²' formation of defects and strength of expansion due to vaporization of hydrogen is not sufficient since the hydrogen implantation dosage was too small, a SOI layer was only partially transferred to a base wafer so that delamination on whole surface of the wafer fell into difficulties, and therefore a SOI wafer could not be produced.

According to the above results, in order to narrow the SOI terrace width and reduce generation of SOI islands in the hydrogen ion implantation delamination method, the hydrogen implantation dosage is preferably less than $7.5 \times 10^{16}$ ions/cm². Further, when the implantation dosage is less than $7.5 \times 10^{16}$ ions/cm² and $5 \times 10^{16}$ ions/cm² or more, the terrace width and generation of SOI islands are almost the same level.

TABLE 1

| Exam. No. | Hydrogen ion implantation dosage [×10$^{16}$ ions/cm$^2$] | SOI island region width [mm] | Terrace width [mm] |
|---|---|---|---|
| 1 | 4.5 | SOI layer could not be transferred to a base wafer | |
| 2 | 5.5 | 0.2 | 2.2 |
| 3 | 6.5 | 0.3 | 2.2 |
| 4 | 7.0 | 0.3 | 2.2 |
| 5 | 7.5 | 1.0 | 2.6 |
| 6 | 8.5 | 1.5 | 3.2 |

On the other hand, LPD densities in each surface of SOI wafers produced under the conditions of each dosage were measured by an optical surface inspection apparatus (SP-1, product of KLA-Tencor Corporation). The measured size of LPDs was 0.19 μm or more, and the region in the edge portion which is exclusive was 5 mm. The average of LPD densities in the wafer surfaces in three standards of the dosages are shown in FIG. 3. It shows that when the implantation dosage is $7.5 \times 10^{16}$ ions/cm$^2$ or more, LPDs are sharply increased, and when the implantation dosage is less than $7.5 \times 10^{16}$ ions/cm$^2$, LPDs are suppressed at the same level.

Therefore, in the method of producing a SOI wafer by an ion implantation delamination method, the hydrogen dosage to be implanted is preferably $5 \times 10^{16}$ ions/cm$^2$ or more and less than $7.5 \times 10^{16}$ ions/cm$^2$, more preferably, $5.5 \times 10^{16}$ ions/cm$^2$ or more and less than $7 \times 10^{16}$ ions/cm$^2$.

The present invention is not limited to the embodiment described above. The above-described embodiment is a mere example, and those having substantially the same structure as that described in the appended claims and providing the similar functions and advantages are included in the scope of the present invention.

For example, in the above-described embodiment, it is explained by exemplifying the case where a silicon single crystal wafer having a diameter of 8 inches is used. However, the present invention is not limited thereto and can be applied to the case where a silicon single crystal wafer having a diameter of 4-16 inches or more is used.

The invention claimed is:

1. A SOI wafer produced by an ion implantation delamination method in which two silicon wafers are bonded, wherein the SOI wafer is produced by the ion implantation delamination method and a silicon wafer is delaminated by a delamination heat treatment, a width of a SOI island region in a terrace portion generated in an edge portion of the SOI wafer where a surface of a base wafer is exposed is narrower than 1 mm, and a density of pit-shaped defects having a size of 0.19 μm or more existing in a surface of a SOI layer detected by a LPD inspection is 1 count/cm$^2$ or less.

* * * * *